United States Patent [19]

Grass

[11] Patent Number: 6,028,408
[45] Date of Patent: Feb. 22, 2000

[54] CONTROL DEVICE FOR A WINDSHIELD WIPER MOTOR

[75] Inventor: Ansgar Grass, Offenburg, Germany

[73] Assignee: Robert Bosch GmbH, Stuttgart, Germany

[21] Appl. No.: 09/155,967

[22] PCT Filed: Jan. 15, 1998

[86] PCT No.: PCT/DE98/00125

§ 371 Date: Feb. 22, 1999

§ 102(e) Date: Feb. 22, 1999

[87] PCT Pub. No.: WO98/34820

PCT Pub. Date: Aug. 13, 1998

[30] Foreign Application Priority Data

Feb. 8, 1997 [DE] Germany .......................... 197 04 807

[51] Int. Cl.$^7$ .................... B60S 1/58; G01R 31/34
[52] U.S. Cl. .................... 318/490; 318/443; 318/444; 318/DIG. 2
[58] Field of Search .................... 318/443, 444, 318/490, DIG. 2; 324/500, 503, 537; 15/250.12; 361/23

[56] References Cited

U.S. PATENT DOCUMENTS

| 3,879,705 | 4/1975 | Binder et al. ............................. 180/272 |
| 4,611,154 | 9/1986 | Lambropoulos et al. .............. 318/490 |
| 4,617,510 | 10/1986 | Deicke et al. ............................. 324/51 |
| 4,857,812 | 8/1989 | Mochizuki et al. ...................... 318/15 |
| 5,497,322 | 3/1996 | Kolomyski et al. ............ 364/424.034 |
| 5,545,956 | 8/1996 | Salvio et al. ............................. 318/283 |
| 5,568,058 | 10/1996 | Wendell .................................. 324/772 |

FOREIGN PATENT DOCUMENTS

| 252 481 | 1/1988 | European Pat. Off. . |
| 511 495 | 11/1992 | European Pat. Off. . |
| 704 343 | 4/1996 | European Pat. Off. . |
| 44 02 476 | 8/1995 | Germany . |

*Primary Examiner*—Bentsu Ro
*Attorney, Agent, or Firm*—Kenyon & Kenyon

[57] ABSTRACT

A control device associated with a wiper motor for motor vehicles, in particular a rear window wiper motor the control device permitting a rapid final test of the motor with virtually no delay. For this purpose, a certain test signal is fed to a control unit via a signal input in response to which test signal the control unit electrically charges the motor for a test mode over an extended period.

9 Claims, 1 Drawing Sheet

CONTROL DEVICE FOR A WINDSHIELD WIPER MOTOR

FIELD OF THE INVENTION

The invention relates to a control device associated with a wiper motor.

BACKGROUND INFORMATION

At the conclusion of the process of manufacturing wiper motors, they must be charged with electricity over an extended period for the final test (i.e., end-of-line test). In this context, the wiper motor data relevant to function and to operation are tested for a duration of approx. 5 to 6 seconds. The extended electrical charging of the wiper motor should be equated with a function corresponding to extended wiping.

In the case of a rear window wiper motor having a control unit arranged on the motor (integrated control unit), the motor's functional scope encompassing only rear window intermittent wiping and rear window washing, the rear window washing function must therefore be activated for the final test. The rear window washing function is made up of three phases: the motor start-up delay, during which the glass is already moistened with water, the subsequent wiping or wiping-washing, and the wiping-dry (usually two or three follow-up cycles). In this context, the time losses resulting from the motor start-up delay and the wiping-dry are disadvantageous for the final test. In other words, the cycle time for the production process of each motor increases unnecessarily in this context as a function of the time for the motor start-up delay and the wiping-dry time that exceeds the test time.

SUMMARY OF THE INVENTION

The control device of the present invention has the advantage that the control unit is fed with a test signal that it can recognize, resulting in an extended electrical charging of the motor for the duration of the test. After the test signal is switched off, the wiping-dry is discontinued, so that the final test is concluded rapidly and virtually without delay.

This control device is to be used with motors having an integrated control unit, since in this context motor and control unit constitute one unit to be tested in the final test.

For example, it is particularly advantageous if the operator selection of the final test is made possible by steering column switch signals. This means that, as a result of a is suitable combination of switching signals at the signal input of the control unit, e.g., triggered by the activation of a switching element which corresponds to a steering column switch having one or a plurality of keys for the functions of intermittent wiping and/or washing, these switching signals are recognized as a test signal by the control unit and thus the final test can be carried out.

Alternatively, it is advantageous that a negative test signal applied at the signal input of the control unit is recognized by the control unit, and thus the final test can be carried out. In this context, recognition of the test signal leads additionally to an immediate extended electrical charging of the motor and thus permits a rapid and virtually delay-free start of the final test of the motor. It is also advantageous that the extended electrical charging of the motor for the purposes of testing can not be unintentionally triggered by the motor vehicle driver.

The duration of the test signal applied is variable and should be selected with a view towards the desired duration of the final test.

An additional advantage results from integrating the control logic and the semiconductor output stage in an ASIC (use-specific IC) arranged on the motor. In this way, the control device is realized in a cost-effective manner.

DETAILED DESCRIPTION

Figure 1:
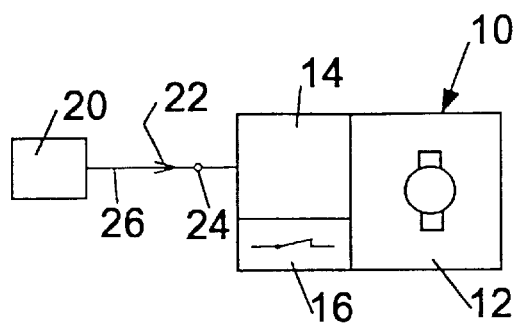
FIG. 1 shows an exemplary embodiment of a control device integrated in a motor for driving a rear window wiper.

FIG. 1 depicts a control device 10 having a control unit 14 which has a semiconductor output stage, control unit 14 being integrated in a rear window wiper motor 12. A park position switch 16, arranged on motor 12 or in its gear box, delivers park position signals to control unit 14. A hall-effect sensor or a contact disk is often used as park position switch 16. In the case of a hall-effect sensor system, a sensor magnet is arranged on the spur gear of motor 12 and the hall-effect sensor on a circuit board. If the contact disk is arranged on the spur gear, the connection to the circuit board is realized using a contact finger.

For the final test, motor 12 arrives at an undepicted test stand. Motor 12 does not drive a wiper, but the load of the wiper is simulated by a motor brake.

In order to initiate the test mode of the final test, a switching element 20 in the test stand, corresponding to a switching element having a key on a steering column switch in a motor vehicle, delivers switching signals 22 over a signal line 26 as input signals to signal input 24 of control unit 14. The test mode leads to an extended electrical charging of motor 12 over the time in which the input signals are present. For the test mode, a period of five to six seconds is usually sufficient.

Figure 2:
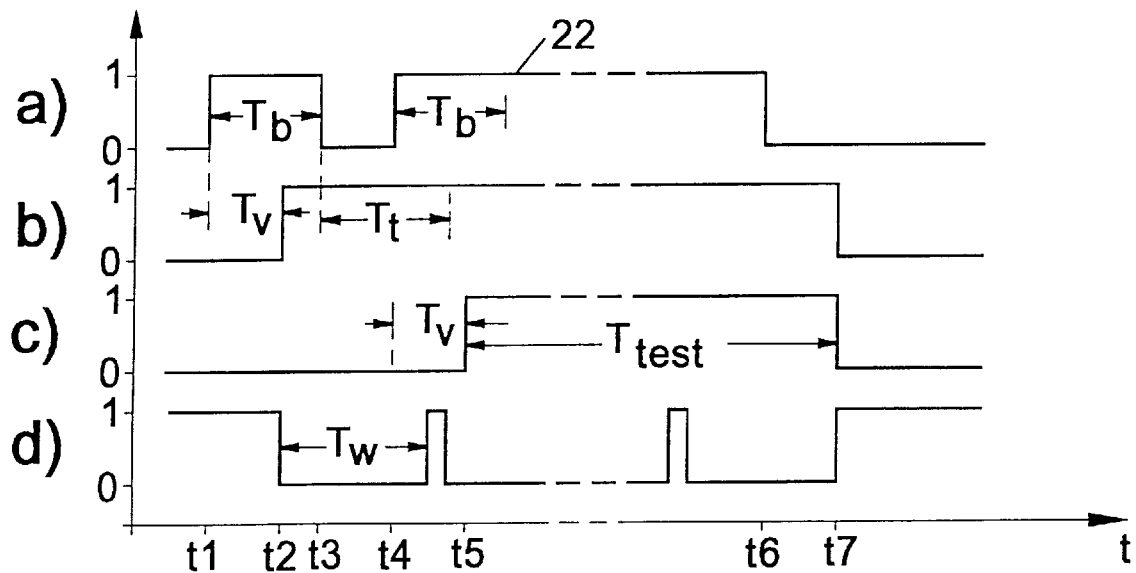
FIG. 2 shows signals or voltage levels from a switching element, motor, test mode for final test and park position switch.

FIG. 2 depicts switching signals 22 of switching element 20 as well as voltage level patterns for motor 12, test mode, and park position switch 16. Signal pattern a) represents switching signals 22 of switching element 20, the initial state of switching signal 22 being inactive (0); pattern b) shows the switching on and off during the electrical charging of motor 12; pattern c) relates to the control unit for the operation of motor 12 in the test mode; pattern d) corresponds to the park position signal of park position switch 16, whose initial state is active (1) in the case of a switched-off motor, i.e., when the wiper is situated in the park position.

Control device 10 of the present invention according to FIG. 1 operates in the following way in accordance with FIG. 2.

In the case of a time-cod ed control unit 14, the two functions of rear window intermittent wiping and rear window washing are triggered by switching signals 22 of varying lengths, which are fed to control unit 14 via a single signal line 26. Switching signal 22 is activated by the operation of the key on switching element 20 (transition 0 to 1). In this context, a timing code in control unit 14 is preset in such a way that in response to the activation of the key for a time period Tb larger than a delay period Tv (Tb>Tv), the rear window washing function is executed. Delay period Tv, in this context, corresponds to the motor start-up delay during the rear window washing function, and it often lies within an order of magnitude of one second. During delay period Tv, the glass is already sprayed with water. After delay period Tv, motor 12 is electrically charged and the wiping-washing phase begins. Upon releasing the key, i.e., deactivating switching signal 22, the water moistening ends and the wiping-washing phase passes over into wiping-dry Tt phase. The number of wiping-dry cycles in control unit 14 is usually set at two or three.

If the activation period is shorter than the delay period (Tb<Tv, touching the key), the rear window intermittent washing function is started. In this context, a short moistening of the glass with water must be permitted. Upon releasing the key, motor 12 starts immediately with the intermittent wiping. When the key is touched once again, the intermittent wiping is ended.

The activation period Tb, however, must always be greater than a minimum period which is predetermined by the debouncing time of the circuit, e.g., 50 milliseconds.

For the final test, motor 12 is placed in a testing stand and control unit 14 is provided with at least three conductors: a signal line 26 and two undepicted conductors for the voltage supply of motor 12. For the final test of the rear window wiper motor, test mode $T_{test}$ should now be selected. For this purpose, first of all, at time point t1 according to FIG. 2, the rear window washing function is activated via signal line 26 by the testing program of the testing stand, i.e., switching signal 22 of switching element 20 must be present longer than delay period Tv. Since motor 12 in the testing stand is not connected to a washing water pump, no water is conveyed in the process.

At the conclusion of delay period Tv at time point t2=t1+Tv, motor 12 is switched on by control unit 14 (signal pattern b) and, in this way, the wiping-washing phase is started. At time point t3, switching signal 22 is deactivated. At that point, the wiping-washing phase passes over into wiping-dry phase Tt. Synchronous with the rotating of the spur gear on motor 12, park position circuit 16 emits the park position signal: inactive (0) outside the park position and active (1) in the park position (signal pattern d).

During wiping-dry Tt, the rear window washing function (signal pattern a) must be activated a second time. This occurs by activating switching signal 22 still within the first wiping cycle Tw at time point t4 for an activation period greater than the delay period (Tb>Tv). This combination of switching signals 22 is recognized by control unit 14 as a test signal and leads to the activation of test mode $T_{test}$ at time point t5=t4+Tv (signal pattern c). Likewise, at time point t5 which is stored in the test program, the final test of motor 12 is started. In this context, the testing program provides, inter alia, for current and rotation measurements of motor 12 under various supply voltages of motor 12 on the test stand. During the final test, second switching signal 22 is activated and thus also test mode $T_{test}$.

At time point t6, switching signal 22 is once again deactivated. However, in test mode $T_{test}$, motor 12 is only switched off by control unit 14 at time point t7 (simultaneously with the switching off of test mode $T_{test}$) if park position circuit 16 detects the park position. Only when the deactivation of switching signal 22 coincides temporally with the activating of the park position signal (t6=t7) does a further wiping cycle Tw take place, in order to assure that the spur gear is in the park position.

In an undepicted alternative arrangement of the exemplary embodiment according to FIG. 1, the signals for the intermittent wiping and rear window washing functions are supplied over two separate signal lines to control unit 14. Switching element 20 thus corresponds to a steering column switch having two keys, the key for the rear window washing function directly triggering the wiping-dry phase in response to an activation period shorter than the delay period (Tb<Tv), but only after the glass has previously been briefly moistened with water. In response to longer activation (Tb>Tv), the rear window washing function is activated as described above. The key for the intermittent wiping function here switches only the intermittent wiping on and off.

For switching the test mode on using the testing program, switching signal 22 is activated on signal line 26 for the rear window washing function, for an activation period shorter than delay period (Tb<Tv) During wiping-dry Tt triggered as a result, switching signal 22 must be activated on the same signal line 26 a second time for an activation period greater than delay period (Tb>Tv).

Here the test mode can be started more rapidly, since the first-time activation period Tb for the rear window washing function can take place in a shorter time than the preset delay period Tv.

The above-described double activation of the rear window washing function in the case of one signal line 26, or of switching signals 22 in the case of two signal lines for switching on the test mode, results from the requirement, when a rear window wiper device is installed in a motor vehicle, to minimize the probability of an unintended triggering of the test mode by the automobile driver.

Figure 3:
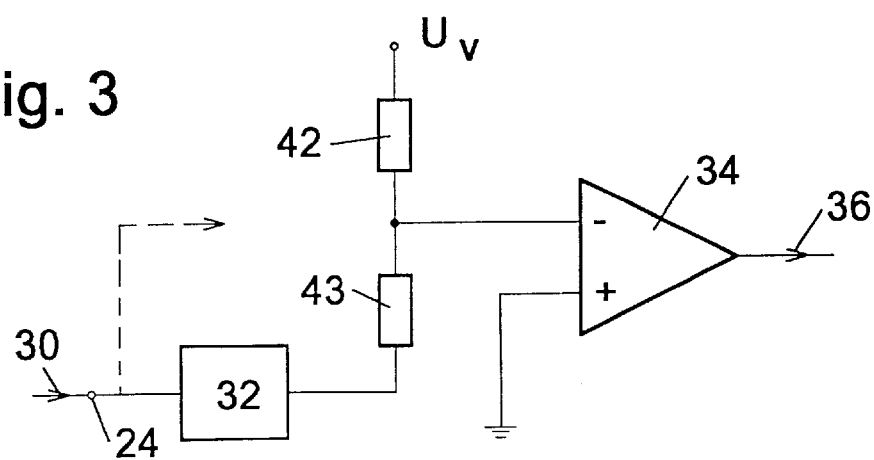
FIG. 3 shows a simplified circuit diagram for activating the final test using a negative test signal.

In a second exemplary embodiment, for the final test, a circuit according to FIG. 3 is installed in control unit 14 according to FIG. 1, preferably at signal input 24, for the rear window washing function.

Input signal 30 at signal input 24 of control unit 14 is first debounced by a debouncing filter 32 and subsequently is applied at the inverting input (−) of a comparator 34.

Resistors 42, 43 are used to limit the current and to divide the voltage, when a potential is applied at signal input 24. If no potential is applied at signal input 24, resistors 42, 43 act as pull-up resistors for the potential at signal input 24 and at the inverting comparator input. Output signal 36 of comparator 34 is fed to a control logic in control unit 14. In accordance with output signal 36, test mode $T_{test}$ is switched on or not switched on. This circuit is integrated in an ASIC, which, inter alia, also contains the control logic for the rear window wiping function. The selection of the rear window wiping functions is realized using mask programming. The circuit according to FIG. 3 is supplied with a positive voltage Uv of approx. 7 V.

The control device of the present invention according to FIG. 1, having the circuit according to FIG. 3, operates in the following manner.

Input signal 30 can be both one of switching signals 22 of switching element 20 as in FIG. 1 as well as a test signal which is supplied independently of them. In the case of a wiper motor 12 installed in a motor vehicle, during normal operating conditions, only positive switching signals 22, as input signal 30 to control unit 14, are supplied by the driver by means of a steering column switch corresponding to switching element 20. These input signals 30 do not lead to activating the test mode. In a further undepicted circuit arranged parallel to this circuit, as indicated by the dotted line, they are evaluated in a conventional manner in control unit 14. In the case of the rear window wiper device installed in an automobile, the final test of motor 12 thus cannot be carried out.

In the beginning, motor 12, which is installed in the test stand for the final test, has no input signal 30 applied at signal input 24 of control unit 14. Thus the inverting input of comparator 34 is set by pull-up resistor 42 at a higher potential than the non-inverting input (+) connected to ground. The voltage level of output signal 36 of comparator 34 having logical output thus amounts to zero (off). In the case of an input potential greater than or equal to zero, a positive voltage is also applied at inverting input of comparator 34. Output signal 36 thus does not alter its voltage level.

To activate the test mode for the final test, as input signal 30, a negative square-wave signal is applied as the test signal. The negative test signal can typically have a voltage of −10 volts. In this case, in accordance with the dimensional design of resistors 42, 43, a negative voltage is applied at the inverting input of comparator 34. In response to the zero passage of the voltage applied at the inverting input, the voltage level of output signal 36 jumps to one (on). The change in voltage level of output signal 36 is detected by the downstream control logic, which for its part immediately triggers the test mode for wiper motor 12. The test mode remains activated as long as the negative test signal is applied at signal input 24 of control unit 14. The switching-off procedure of the test mode and motor 12 is carried out as described above.

Negative voltage spikes, which, for example, can occur in the vehicle electrical system of an automobile, are extinguished by debouncing filter 32 and thus do not trigger a test mode. Positive voltage spikes do not lead to a change in the voltage level at the signal output of comparator 34. However, they are also extinguished by debouncing filter 32.

The circuit arrangement according to FIG. 3 can be applied to every signal input of control unit 14. This can also be a separate signal input of control unit 14, i.e., an input to which only the test signals are fed.

What is claimed is:

1. A control device comprising:

a wiper motor for a motor vehicle; and a control unit integrated at the wiper motor and having at least one signal input, wherein the control unit receives a test signal via the at least one signal input, and wherein, in response to the test signal, the control unit automatically determines if the wiper motor is being tested in a test mode and electrically charges the wiper motor for the test mode.

2. The control device according to claim 1, wherein the wiper motor is a rear wiper motor.

3. The control device according to claim 1, wherein the test signal has a negative voltage level.

4. The control device according to claim 1, wherein, after the test signal is switched off, the wiper motor remains electrically charged for one of a remaining duration of a wiping cycle and a third duration of the wiping cycle.

5. A control device comprising:

a wiper motor for a motor vehicle;

a control unit integrated at the wiper motor and having at least one signal input; and a switching element transmitting switching signals via the at least one signal input, the switching signals selecting at least one of an intermittent wiping function and a washing function, wherein the control unit receives a test signal via the at least one signal input, wherein the control unit recognizes a predetermined signal as the test signal at the at least one signal input, the predetermined signal deviating from the switching signals for one of the intermittent wiping function and the washing function, and wherein, in response to the predetermined signal, the control unit electrically charges the wiper motor for a test mode.

6. The control device according to claim 5, wherein the test signal includes a temporal sequence of the switching signals.

7. A control device comprising:

a wiper motor for a motor vehicle; and a control unit integrated at the wiper motor and having at least one signal input;

wherein the control unit receives a test signal via the at least one signal input, wherein, in response to the test signal, the control unit electrically charges the wiper motor for a test mode, and wherein a first duration of electrical charging of the wiper motor is determined as a function of a second duration of the test signal.

8. A control device comprising:

a wiper motor for a motor vehicle;

a control unit integrated at the wiper motor and having at least one signal input;

a debouncing filter; and a comparator, wherein the control unit receives a test signal via the at least one signal input, wherein the test signal has a negative voltage level, wherein, in response to the test signal, the control unit electrically charges the wiper motor for a test mode, and wherein the debouncing filter and the comparator recognize the test signal.

9. The control device according to claim 8, wherein the debouncing filter and the comparator are integrated into an ASIC.

* * * * *